THIN FILM PIEZOELECTRIC RESONATOR

Filed Oct. 17, 1968 2 Sheets-Sheet 1

WITNESSES:
Bernard R. Giaguey
Lee P. Johns

INVENTOR
Stoyan M. Zalar
BY
R. Y. Menzemer
ATTORNEY

THERMAL OXIDATION OF SILICON

United States Patent Office 3,486,046
Patented Dec. 23, 1969

3,486,046
THIN FILM PIEZOELECTRIC RESONATOR

Stoyan M. Zalar, Pittsburgh, Pa., assignor to Westinghouse Electric Corporation, Pittsburgh, Pa., a corporation of Pennsylvania Filed Oct. 17, 1968, Ser. No. 768,468
Int. Cl. H04r 17/00
U.S. Cl. 310—8 6 Claims

ABSTRACT OF THE DISCLOSURE

A self-supporting silica or metal membrane for thin film piezoelectric resonator whose membrane has a thickness substantially equal to a multiple of the half wavelength of the sound wave. The membrane is self-supported at its periphery.

BACKGROUND OF THE INVENTION

Field of the invention

This invention relates to a thin film piezoelectric resonator and more particularly it pertains to a silica or metal membrane as a substrate therefor.

Description of the prior art

A need for resonators having a higher frequency sensitivity has led to the development of thin film tuning (resonating) devices such as those composed of cadmium sulfide (CdS). Films of such materials in the frequency range of from 150 to 1000 hertz have acoustic thicknesses of a half wavelength of between 15 and 2.2 microns.

When resonators of that minute thickness are mounted on rigid substrates of prior construction, the acoustic waves are partially or wholly dissipated. In other words, the acoustic waves penetrate the substrate and are reflected back in a scattered pattern; or the waves are substantialy absorbed by the substrate. The foregoing is especially true where the substrate is thick, say in the order of one millimeter (=1000 microns)

SUMMARY OF THE INVENTION

It has been found in accordance with this invention that the foregoing problem may be overcome where the film-like resonator is mounted on a silica or metal membrane that is self-supporting and that has a thickness that is substantially equal to a multiple of a whole or half integer of the wavelength to be used in the resonator. The invention also pertains to a method for making a self-supporting silica or metal membrane.

Accordingly, it is a general obect of this invention to provide a thin film piezoelectric resonator having higher frequency sensitivity than has been available heretofore.

It is another object of this invention to provide a thin film piezoelectric resonator by which acoustic waves are produced in an undissipated manner.

It is another object of this invention to provide a thin film piezoelectric resonator having precisely the desired thickness to avoid dissipation of the energy of the acoustic wave involved.

It is another obpect of this invention to provide a method for making thin film piezoelectric resonators.

Finally, it is an object of this invention to satisfy the foregoing problems and desiderata in a simple and expedient manner.

Specifically, the device of this invention comprises a thin film resonator for the 250 to 300 megahertz range having a half-wavelength acoustic thickness from about 8.9 to 7.45 microns, the resonator being composed of a piezoelectric material, the resonator having a thickness substantially equal to a half wavelength of the desired frequency, a membranous substrate having a thickness substantially equal to a multiple of a half-wavelength, the substrate having a peripheral support, the resonator being located on the substrate substantially centrally of the periphery, whereby high frequency sensitivity is provided and resonated without dissipation of acoustic energy.

BRIEF DESCRIPTION OF THE DRAWINGS

For a better understanding of the invention, reference is made to the following description together with the accompanying drawings, in which.

Similar numerals refer to similar parts throughout the several views of the drawings.

DESCRIPTION OF THE PREFERRED EMBODIMENT

Figure 6:
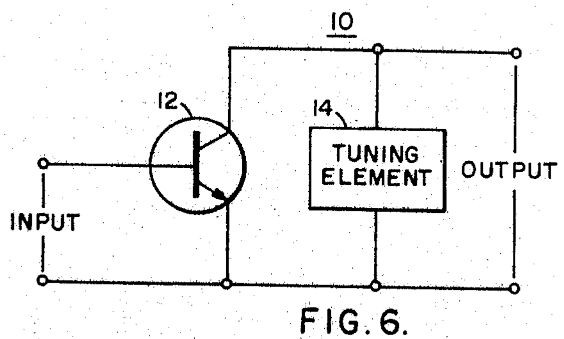
FIG. 6 is a schematic diagram of electric circuit elements that may be joined in accordance with the principles of the present invention.

In FIG. 6 a portion of a circuit 10 is illustrated and includes elements intended to be integrated in a unitary structure. The circuit 10 includes a transistor amplifier 12 which is coupled to a tuning element 14. For clarity a conventional circuit for applying the necessary DC biases to the transistor amplifier 12 is not shown. The tuning element 14 provides frequency selectivity in the amplification of the amplifier 12 as, for example, is desired in the intermediate frequency amplifier stages of a super-heterodyne radio receiver.

Figure 5:
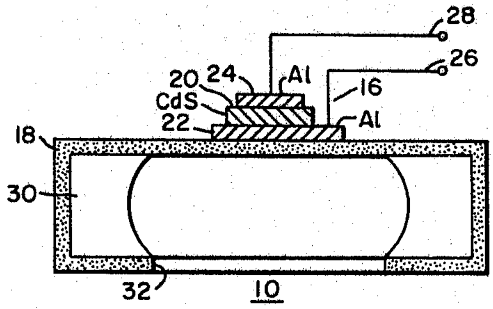
FIG. 5 is a view showing a capacitor-like piezoelectric resonator mounted on the external surface of the silicon dioxide membrane.

One form of the tuning element 10 is illustrated in the structure of FIG. 5. It includes a capacitor-like structure generally indicated at 16 and a substrate or membrane 18. The capacitor 16 includes a film 20 of resonator material, and a pair of electrodes 22 and 24, all of which are formed on the surface of the membrane 18. Lead wires 26 and 28 extend from each of the electrodes 22 and 24, respectively.

The film 20 which forms the tuning or resonating member of the assembly is composed of a material which is sensitive to high frequencies such as above 1 megahertz. The film 20 is composed of a piezoelectric material such as cadmium sulfide, zinc oxide, cadmium selenide, and gallium arsenide. The preferred material is cadmium sulfide which is applied by a vacuum deposition of a thin layer having a thickness substantially equal to one-half the wavelength of the particular frequency involved. Thus the piezoelectric film 20 is applied to a thickness dependent upon the specific frequency for which it is to be used.

The electrodes 22 and 24 are composed of a suitable metal such as aluminum, gold, silver, and chromium. Aluminum is particularly suitable because of its ease of vacuum evaporation in the thickness desired.

The membrane 18 has a thickness which is equal to an integral multiple of one-half of the wavelength of the particular frequency to which the film 20 is sensitive. That is the thickness of the membrane 18 may be equal to one, two, etc. times the thickness of the film 20. Inasmuch as the membrane 18 has such a finite thickness, it is composed of an amorphous, isotropic material such as silica ($SiO_2$) which may be formed to the precise thickness as indicated. Silica in its amorphous and isotropic form is not piezoelectric. The preferred material would be monocrystalline quartz which is anisotropic and which is piezoelectric, but which cannot be made or grown in thicknesses thin enough to be equal to low multiples of one-half of the wavelength of the frequency involved.

In addition of the foregoing, other materials may be employed to form self-supporting resonant or non-resonant substrates which other materials may include nitrides such as $Si_3N_4$, $Ge_3N_4$, AlN, BN oxides of metals such as Al, Ta, Ti, or metals such as nickel, chromium, and platinum.

Whatever the composition of the membrane 18, its thickness is equivalent to a half wavelength of the specific frequency involved which is in the frequency range from about 100 to 1000 megahertz situated between ultrashort radio waves and microwaves.

The following fabrication steps are suggested for the membrane and are particularly employed where the membrane is composed of silica ($SiO_2$):

(1) Preparation of a clean and polished wafer or slice of silicon having plane-parallel opposite sides in accordance with silicon semiconductor technology, and having a thickness of from about 3 to 10 mils;

(2) Formation of silicon dioxide layer on all surfaces of the silicon slice or wafer such as by thermal growth by wet oxidation of the silicon surface to a predetermined thickness normally exceeding 2 microns;

(3) Formation of a "photolithographic window" or opening through the silicon dioxide layer on one side of the silicon slice;

(4) Etching the silicon adjacent to the window or opening in order to completely remove the silicon through to the silicon dioxide layer on the opposite side of the opening;

(5) Depositing a film or electrode of metal on the external surface of the silicon dioxide layer on said opposite side;

(6) Forming a thin film resonator of piezoelectric material on the film of metal electrode to a thickness substantially equal to one-half the wavelength of the resonant acoustic wave involved; and (7) Applying another film or electrode of metal on the top surface of the layer of piezoelectric material.

Figure 1:
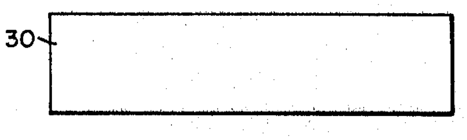
FIGURE 1 is a sectional view through a slice or wafe of silicon.
Figure 2:
FIG. 2 is a sectional view through a silicon slice having an outer coating of silicon dioxide.

The several steps involved are indicated in FIGS. 1 to 5 of the drawings. In FIG. 2 a slice 30 of silicon having a thickness of from 3 to 10 mils is provided with opposite sides that are plane-parallel and cleaned and polished in accordance with established semiconductor technology.

In FIG. 2 the silicon slice 30 is provided with an external layer of silicon dioxide, which layer ultimately forms the membrane 18 (FIG. 5). The thickness of the membrane or layer 18 may vary from about 3 to 10 microns. Inasmuch as the time involved in the process such as thermal oxidation of applying the layer or membrane is long, such as 100 hours for 7.45 micron thickness, the thickness of the oxide can be readily controlled. The accuracy of the thickness measurements is better than one interference band of $SiO_2$ (in a sodium light: 2000 A.), normally about ±1000 A., or one-tenth of a micron. Silica layers, grown under prescribed conditions of 1200° C. in a stream of oxygen: 660 ccm./min., steam temperature: 900° C., are amorphous and structurally analogous to fused quartz.

Where the silica layer is formed by thermal oxidation in a stream of oxygen at about 1000 to 1100° C. the formula of formation is as follows:

$$Si+O_2 \rightarrow SiO_2 \quad (1)$$

The silica layer or membrane may also be formed by vapor deposition at about 850° C. in accordance with the formula:

$$SiH_4+O_2 \rightarrow SiO_2+2H_2 \quad (2)$$

Figure 3:
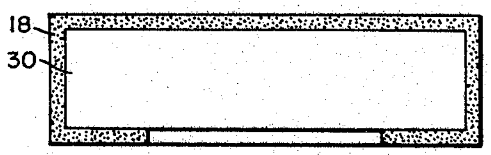
FIG. 3 is a view similar to FIG. 2 in which an opening or window is provided in the coating on one side of the slice.

In FIG. 3 an opening or "photolithographic window" is provided on one side such as the undersurface of the oxide layer. The opening is formed by the photoresist method, using a mixture of $NH_4F$—HF (3:1) for etching of the oxide "window" or opening 32. For that purpose, Apiezon wax is used to protect the opposite side of the silicon from etching. Other protective coating may be used however.

Figure 4:
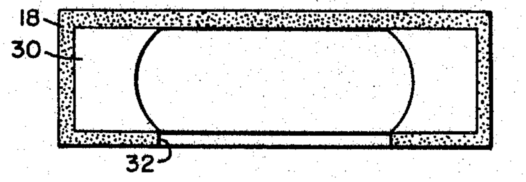
FIG. 4 is a sectional view showing a portion of the silicon slice removed by etching.

As shown in FIG. 4, the central portion of the silicon disc 30 is then removed by etching in the area of the window 32. For that purpose the silicon 30 is completely removed from the inner surface of the layer or membrane 18. The etching procedure may include either a mixture of hot chlorine gas and argon, or an etching agent composed of 75% $HNO_3$+12.5% $CH_3$—COOH+12.5% HF. The silicon may also be removed by etching electrolytically in a 10% KOH solution. Satisfactory results were accomplished by the chlorine etch at 900° C. in a mixture of chlorine-argon 1:1. Chlorine attacks silicon only and leaves the oxide layer or membrane 18 untouched and clear. Chlorine gas is used and is thoroughly dried because the presence of moisture forms a white and opaque secondary oxide, probably by the following reactions:

$$Si+2Cl_2=SiCl_4 \quad (3)$$

$$SiCl_4+2H_2O=SiO_2+4HCl \quad (4)$$

Thus a resonant membrane 18 of silica is provided which is compatible with monolithic and hybrid integrated circuits as produced my modern microelectronics.

Thereafter as shown in FIG. 5, the layer 22 of a metal electrode is formed preferably by depositing the layer on the surface of the membrane 18 and substantially centrally thereof to a thickness ranging from about 3000 to 5000 A.

The film or layer 20 of piezoelectric material, preferably CdS, is then deposited on the metal electrode 22. For that purpose the film 20 has a thickness corresponding to one-half wavelength of the particular frequency involved. For example, for the resonant frequency of 300 microhertz, the film 20 and the membrane 18 have a thickness of 7 microns each. Under these conditions the total length of the "piezoelectric" line is one wavelength, which means that the acoustic energy, generated in the film 20 of CdS, is substantially completely reflected because the ratio of acoustic impedances silica-air is very large.

It is assumed that the total quality factor Q (defined as $f_0/\Delta f$, where $f_0$ is the resonant frequency and $\Delta f$ is the bandwidth measured at amplitudes of $1/\sqrt{2}$ times the maximum resonant amplitudes) of the above acoustic "double" structure follows the usual summation law:

$$Q_T=1\Big/\left(\frac{1}{Q_{CdS}}+\frac{1}{Q_{SiO_2}}\right) \quad (5)$$

Thereafter the film 24 of a metal electrode such as aluminum is formed on the upper surface of the film 20 of piezoelectric material in order to provide a capacitor including the metal films 20, 24 and the film 20 of piezoelectrical material.

Figure 7:
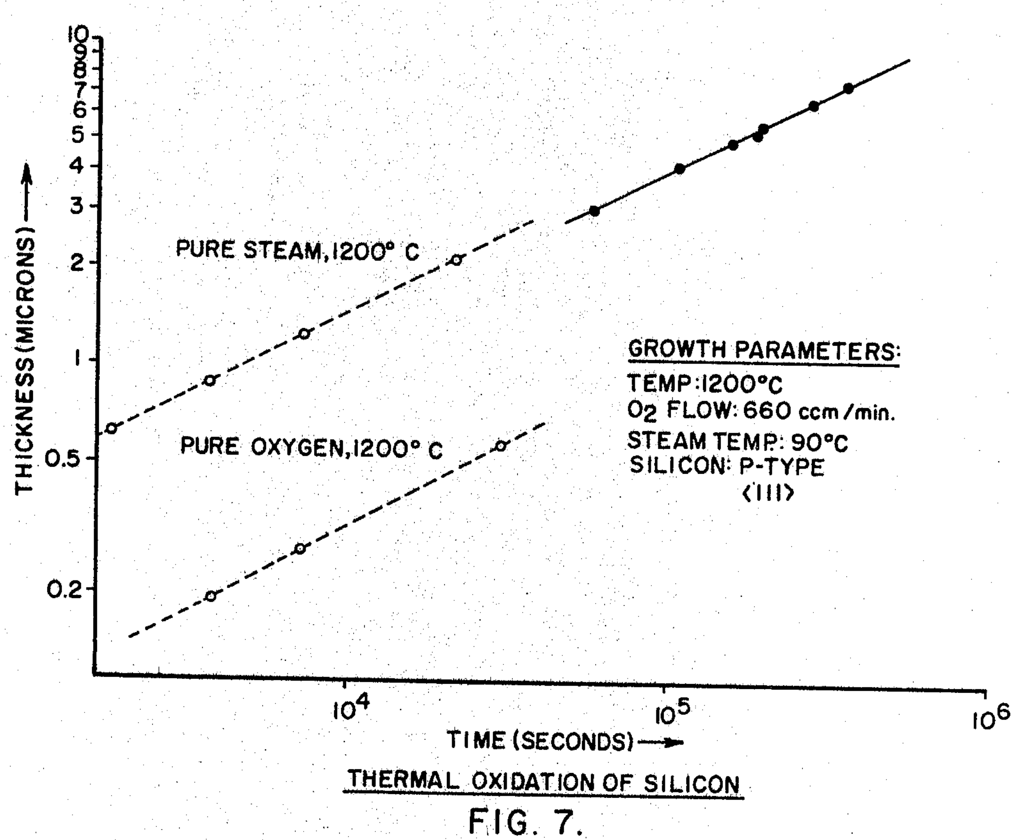
FIG. 7 is a graph showing the thickness in microns of the silicon dioxide growth for increasing time periods in a pure steam atmosphere and in pure oxygen.

In a series of separate experiments it was demonstrated that layers of $SiO_2$ that are thicker (3 to 8 microns) and reproducible are obtainable by extending the time of thermal growth up to five days. The results of the experiments are shown in FIG. 7 which includes work of other experimenters for shorter periods of time for oxidation of silicon in steam and oxygen.

Accordingly, silica membranes produced by the proposed technique are used for substrates for piezoelectric thin film resonators of a thickness of 10 to 50 microns in which they serve only for mechanical support.

It is understood that the above specification and drawings are merely exemplary and not in limitation of the invention.

What is claimed is:

1. In a piezoelectric resonator for use with a frequency range of up to 1000 megahertz, comprising a membranous member having a rigidly supported peripheral portion, the member being composed of one material selected from a group consisting of $SiO_2$, $Si_3N_4$, $Ge_3N_4$, AlN, BN, $Al_2O_3$, $Ta_2O_5$, $TiO_2$, Cr, Pt, and nickel, a condenser mounted centrally on one side of the member, the condenser including a film of piezoelectric material and a metallic coating on each opposite side of the film, one of the coatings being secured on the member, the film having a thickness equal to one-half the wavelength of a frequency in the range of from 100 to 1000 megahertz, and the member having a thickness equal to a multiple of one-half the wavelength of the same frequency as the film.

2. The device of claim 1 wherein the piezoelectric material is cadmium sulfide.

3. The device of claim 1 wherein the piezoelectric material is cadmium selenide.

4. The device of claim 1 wherein the piezoelectric material is ZnO.

5. The device of claim 1 wherein the piezoelectric material is gallium arsenide.

6. The device of claim 1 wherein the metallic coating is one element selected from a group consisting of aluminum, gold, silver, and chromium.

References Cited

UNITED STATES PATENTS

| | | | |
|---|---|---|---|
| 3,351,786 | 11/1967 | Muller | 310—8 |
| 3,367,159 | 2/1968 | Sihvonen | 317—26 |
| 3,388,002 | 6/1968 | Foster | 117—217 |
| 3,414,832 | 12/1968 | Newell | 317—26 |

OTHER REFERENCES

IEEE Transactions on Sonics and Ultrasonics, vol. SU15, No. 1, January 1968.

J. D. MILLER, Primary Examiner

U.S. Cl. X.R.

310—82; 317—235; 331—155